United States Patent
Lin

(10) Patent No.: US 7,696,814 B2
(45) Date of Patent: Apr. 13, 2010

(54) FILTER CIRCUIT AND METHOD THEREOF

(75) Inventor: Shian-Ru Lin, Hsinchu (TW)

(73) Assignee: Realtek Semiconductor Corp., Hsinchu (TW)

(*) Notice: Subject to any disclaimer, the term of this patent is extended or adjusted under 35 U.S.C. 154(b) by 8 days.

(21) Appl. No.: 11/898,309

(22) Filed: Sep. 11, 2007

(65) Prior Publication Data

US 2008/0061879 A1   Mar. 13, 2008

(30) Foreign Application Priority Data

Sep. 13, 2006   (TW)   ............... 95133775 A

(51) Int. Cl.
*H03B 1/00*   (2006.01)
*H03K 5/00*   (2006.01)
*H04B 1/00*   (2006.01)

(52) U.S. Cl. .............. 327/554; 327/552; 327/553
(58) Field of Classification Search ......... 327/552–554, 327/560, 563
See application file for complete search history.

(56) References Cited

U.S. PATENT DOCUMENTS 5,680,070 A * 10/1997 Anderson et al. ........... 327/336
2005/0052225 A1 * 3/2005 Cusinato .................... 327/552

* cited by examiner

*Primary Examiner*—Lincoln Donovan
*Assistant Examiner*—Daniel Rojas
(74) *Attorney, Agent, or Firm*—Thomas, Kayden, Horstemeyer & Risley

(57) ABSTRACT

A filter circuit is disclosed which comprises a differential amplifier and a switch-capacitor circuit. The invention attains the goals of reducing the power consumption and the circuit size by sharing an amplifier with other related circuits to reduce the number of amplifiers.

30 Claims, 8 Drawing Sheets

FILTER CIRCUIT AND METHOD THEREOF

BACKGROUND OF THE INVENTION

1. Field of the invention

The invention relates to a filter circuit, and more particularly, to a filter circuit that shares a differential amplifier.

2. Description of the Related Art

FIG. 1 is a block diagram of a receiver for a conventional network transceiver. The receiver 100 includes a front-end receiver 110, a feedforward equalizer 120, a noise canceller 130, a timing recovery device 140 and a decoder 150. The front-end receiver 110 may include an analog auto-gain controller 111, a low-pass filter 112, a sample-and-hold circuit 113, an inverse partial response (IPR) filter 114 and an analog to digital converter (ADC) 115.

The analog auto-gain controller 111 receives an input signal sent by a transmitter of a remote transceiver and then adjusts the amplitude of the input signal to fit the pre-defined operating range of the low-pass filter 112. The low-pass filter 112 receives the output of the analog auto-gain controller 111 and then attenuates the high-frequency noise. The sample-and-hold circuit 113 subsequently samples and holds the output of the low-pass filter. Then, the IPR filter 114 compensates inter-symbol interference introduced by the transmitter of the remote transceiver in order to reduce a peak-to-average ratio of the signal to be fed into the ADC 115. Meanwhile, the IPR filter 114 reduces the magnitude of the quantized noise and increases the signal-to-noise ratio for further signal processing. The IPR filter 114 is an infinite impulse response filter with a transfer function $H(z)=1/(1+Kz^{-1})$, where K is a positive real number that is less than one. The ADC 115 coupled to the IPR filter 114 converts the output of the IPR filter 114 into a digital signal by analog to digital conversion.

It is common to have two fully-differential amplifiers respectively installed in both the IPR filter 114 and the ADC 115 of the conventional receiver 100. Nevertheless, the excessive power consumption and ever-increasing manufacturing cost are inducing a trend of providing a low-price, high-efficiency, power-saving and compact circuit design for the next generation of chip industry. Hence, a need exists for a new filter that reduces the number of amplifiers so as to save power consumption and die area as well.

SUMMARY OF THE INVENTION

In view of the above-mentioned problems, an object of the invention is to provide a filter circuit in order to reduce the number of amplifiers by sharing a common amplifier with other related circuits, thereby saving the power consumption and reducing the circuit size.

To achieve the above-mentioned object, the filter circuit capable of sharing a differential amplifier comprises: a differential amplifier for receiving an input signal and generating an output signal; and, a switch-capacitor circuit for storing charges generated by both the input signal and the output signal and coupling with the differential amplifier during at least one of a plurality of state periods; wherein the input signal and the output signal generate the same transfer function during each of the plurality of state periods. Wherein, the filter is an IPR filter and the differential amplifier is a fully-differential amplifier.

Another objective of the invention is to provide a method of filtering, applied to a circuit that shares a differential amplifier, comprising: receiving an input signal and generating an output signal by using a differential amplifier; storing charges generated by the input signal and the output signal by using a switch-capacitor circuit; and, coupling the switch-capacitor circuit with the differential amplifier during at least one of a plurality of state periods; wherein the input signal and the output signal generate the same transfer function during each of the plurality of state periods.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The filter circuit of the invention and method thereof will be described with reference to the accompanying drawings.

Figure 1:
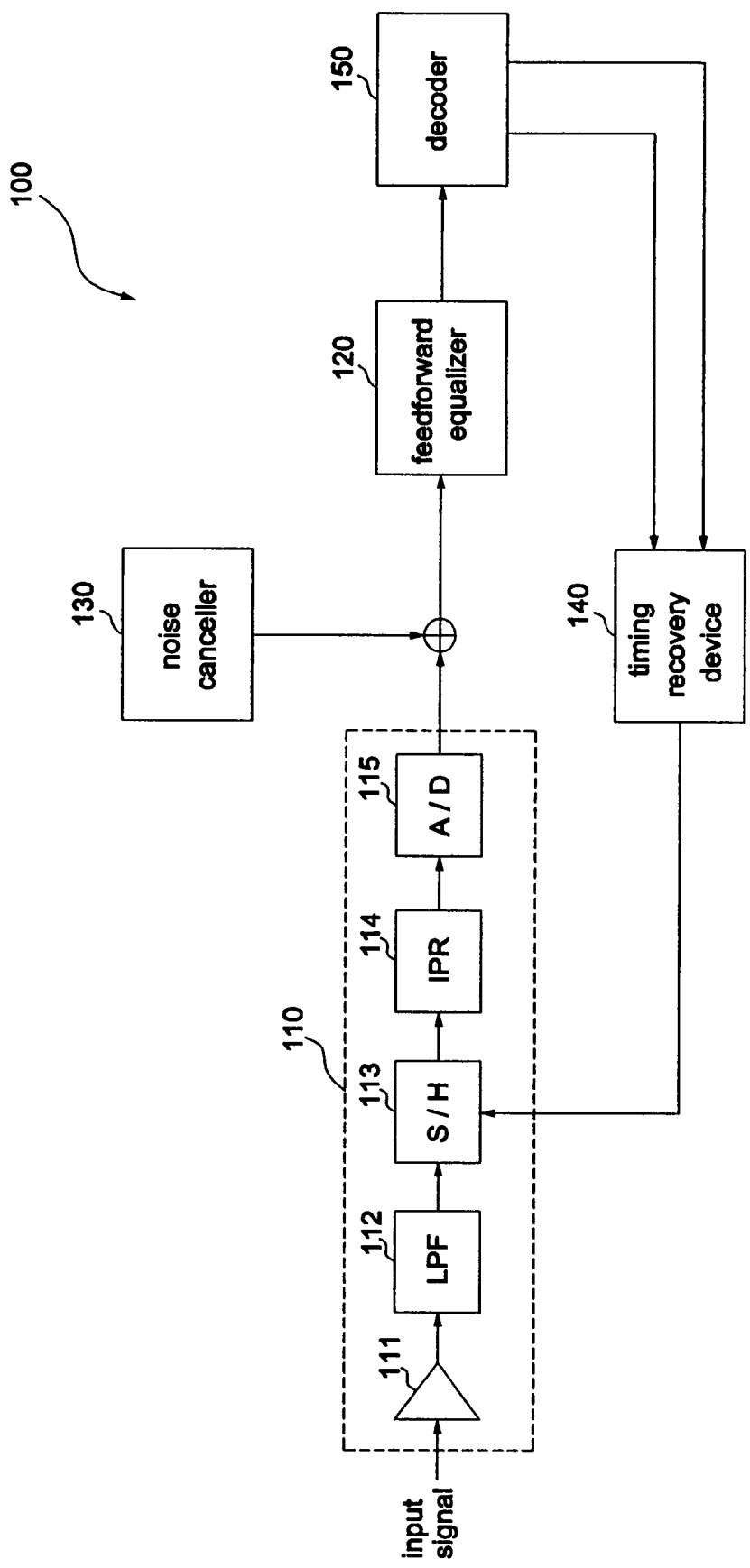
FIG. 1 is a block diagram of a receiver for a conventional network transceiver.
Figure 2:
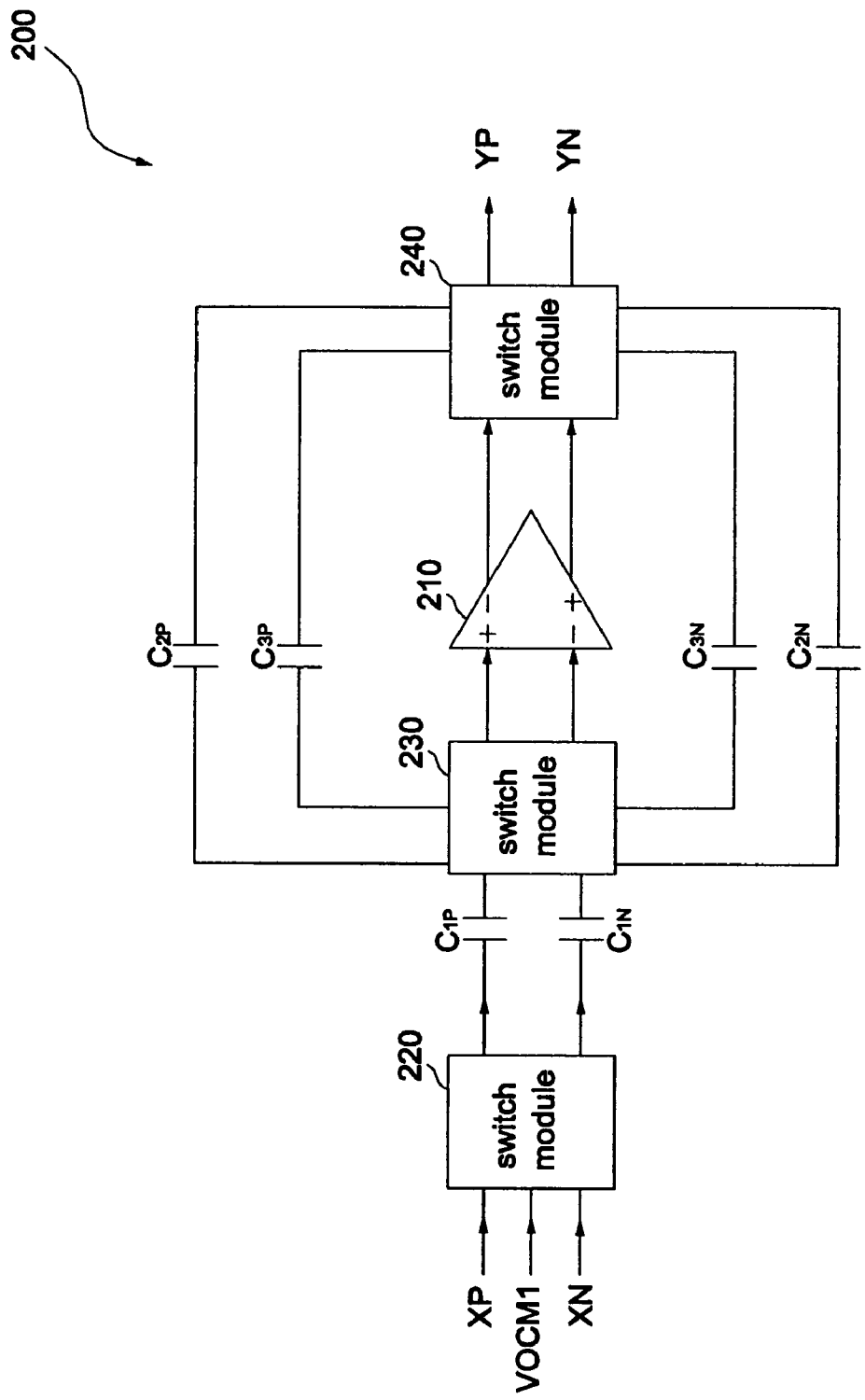
FIG. 2 is a block diagram of an IPR filter according to an embodiment of the invention.

FIG. 2 is a block diagram of an IPR filter illustrated according to an embodiment of the invention. According to the embodiment, a switch-capacitor circuit structure is provided to share a common amplifier. An IPR filter 200 of the invention receives two input signals XP, XN and a front-end common-mode output voltage VOCM1 to generate two output signals YP, YN. The IPR filter 200 includes a fully-differential amplifier 210 and a switch-capacitor circuit including three switch modules 220, 230, 240 and six capacitors $C_{1P}$, $C_{1N}$, $C_{2P}$, $C_{2N}$, $C_{3P}$, $C_{3N}$.

Figure 3:
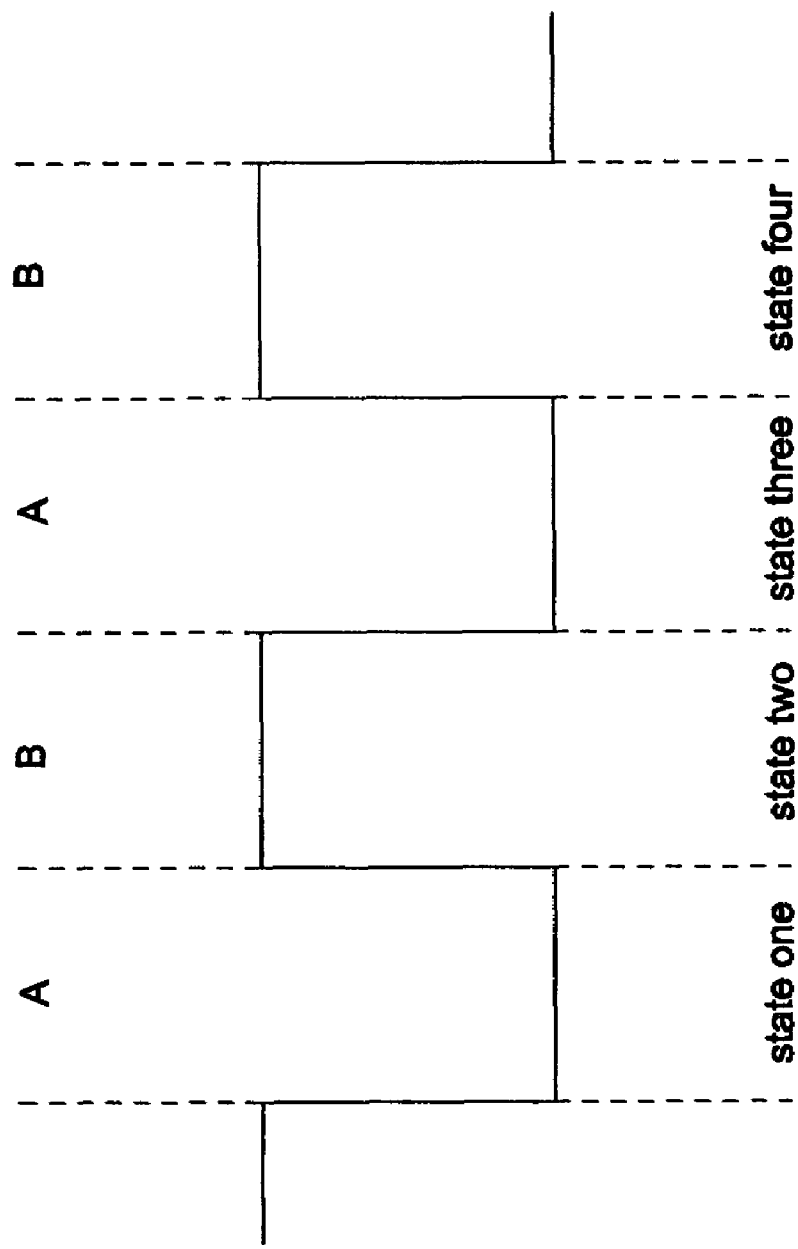
FIG. 3 is a diagram showing the relationship between system clock cycles and four states.

FIG. 3 is a diagram showing the relationship between system clock cycles and the four states. While the IPR filter 200 is in operation, it takes two system clock cycles to complete the IPR filtering operation. In other words, the entire filtering operation of the IPR filter 200 can be divided into four states (or stages): state one, state two, state three and state four. The IPR filter 200 operates repeatedly according to the numerical order of the four states, i.e. state one, state two, state three, state four, and so on.

Please refer to FIGS. 2 and 3. The IPR filter 200 is in a hold mode in state one and in state three, whereas the IPR filter 200 is in a sample mode in state two and in state four. In addition, the three switch modules 220, 230, 240 have different connecting configurations in different states. The IPR filter 200 enables sharing of a common amplifier (i.e. the fully-differential amplifier 210 in this embodiment) with another circuit by setting itself in the hold mode during the falling edge A of the system clock and in the sample mode during the rising edge B of the system clock. The fully-differential amplifier 210 is only necessary during the falling edge A. In order to achieve the purpose of sharing a common amplifier, the capacitance of the capacitors $C_{1P}$, $C_{1N}$ is designed to be three times that of the capacitors $C_{2P}$, $C_{2N}$ and the capacitance of the capacitors $C_{3P}$, $C_{3N}$ is designed to be two times that of the capacitors $C_{2P}$, $C_{2N}$.

Suppose that the IPR filter 200 shares a common fully-differential amplifier 210 with a multiply-digital-to-analog converter (MDAC1) 480A, which is a first stage circuit of the ADC 115. Referring to FIG. 2, let the capacitance of the capacitors $C_{1P}$, $C_{1N}$ be equal to 3C, the capacitance of the capacitors $C_{2P}$, $C_{2N}$ be equal to C and the capacitance of the capacitors $C_{3P}$, $C_{3N}$ be equal to 2C. Hereinafter, four states of the IPR filter 200 will be described in detail according to the charge conservation law.

Figure 4A:
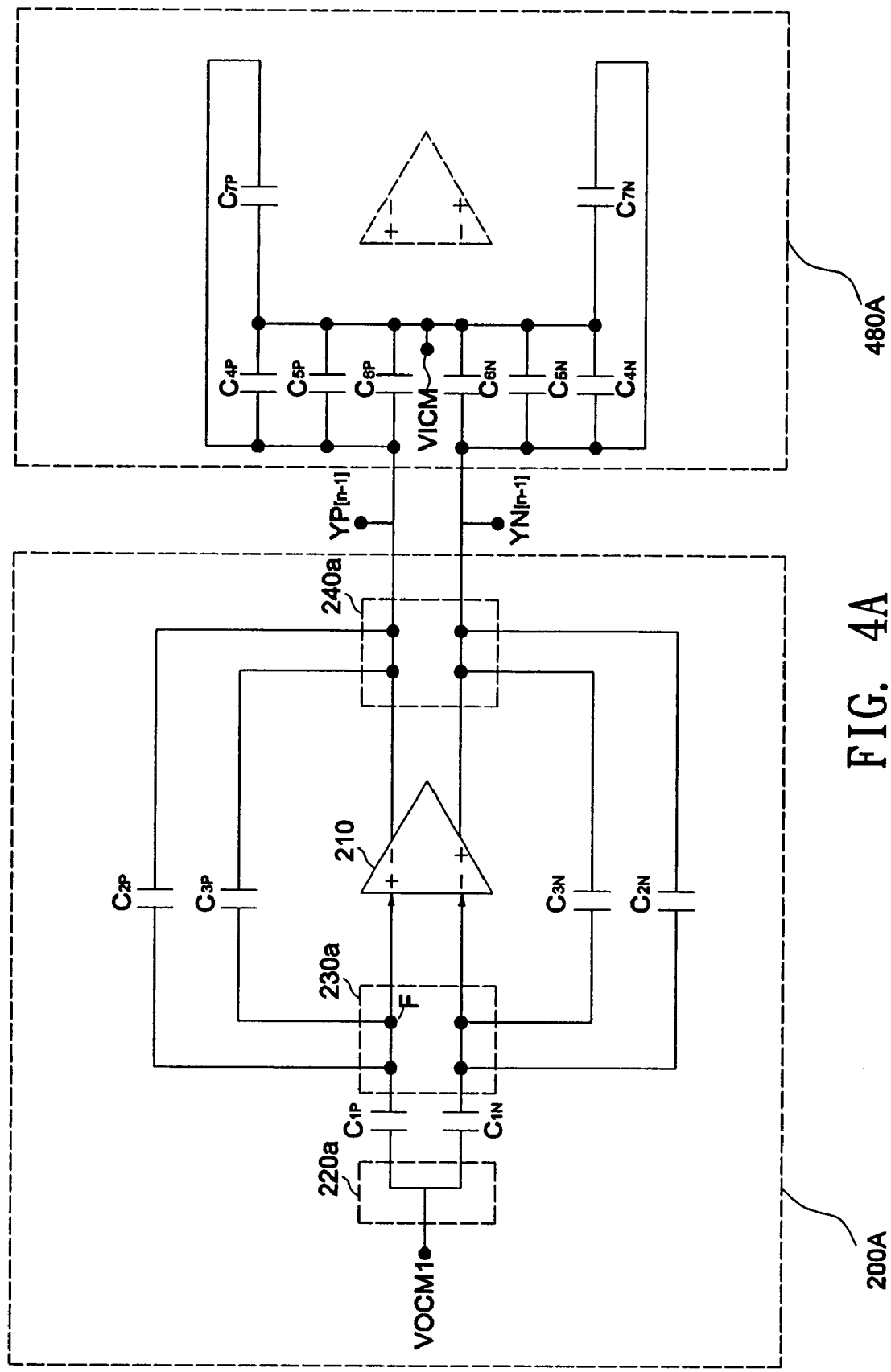
FIG. 4A is a circuit diagram of the IPR filter in state one according to the embodiment of the invention.

State One: referring to FIGS. 3 and 4A, state one begins with a first falling edge A and is hereinafter called the hold mode one. Suppose that the current time is Time=t[n−1]. The IPR filter 200A uses the fully-differential amplifier 210 for operations, which is therefore represented in solid lines. In the meantime, the MDAC1 circuit 480A operates without the fully-differential amplifier 210 that is represented in dotted lines. During the period of state one, the output signals YP[n−1], YN[n−1] of the fully-differential amplifier 210 are the output signals of the IPR filter 200A. The switch module 220a simultaneously feeds the front-end common-mode output voltage VOCM1 into the capacitors $C_{1P}$, $C_{1N}$. The positive (negative) input terminal of the fully-differential amplifier 210 and one terminal of each of the three capacitors $C_{1P}$, $C_{2P}$, $C_{3P}$ ($C_{1N}$, $C_{2N}$, $C_{3N}$) are shorted together in the switch module 230a. The negative (positive) output terminal of the fully-differential amplifier 210 and two capacitors $C_{2P}$, $C_{3P}$ ($C_{2N}$, $C_{3N}$) are shorted together in the switch module 240a. According to the formula Q=C×V (where Q denotes the amount of charge, C denotes the capacitance and V denotes the voltage), the amount of charge in the capacitor $C_{2P}$ is $Q_{2P}$[n−1]=C×YP[n−1] while the amount of charge in the capacitor $C_{2N}$ is $Q_{2N}$[n−1]=C×YN[n−1]. Since the output signals have opposite polarities, i.e., YP[n−1]=−YN[n−1], the two capacitors $C_{2P}$, $C_{2N}$ will store the same amount of charge but with opposite polarities, i.e., $Q_{2P}$[n−1]=−$Q_{2N}$[n−1].

Figure 4B:
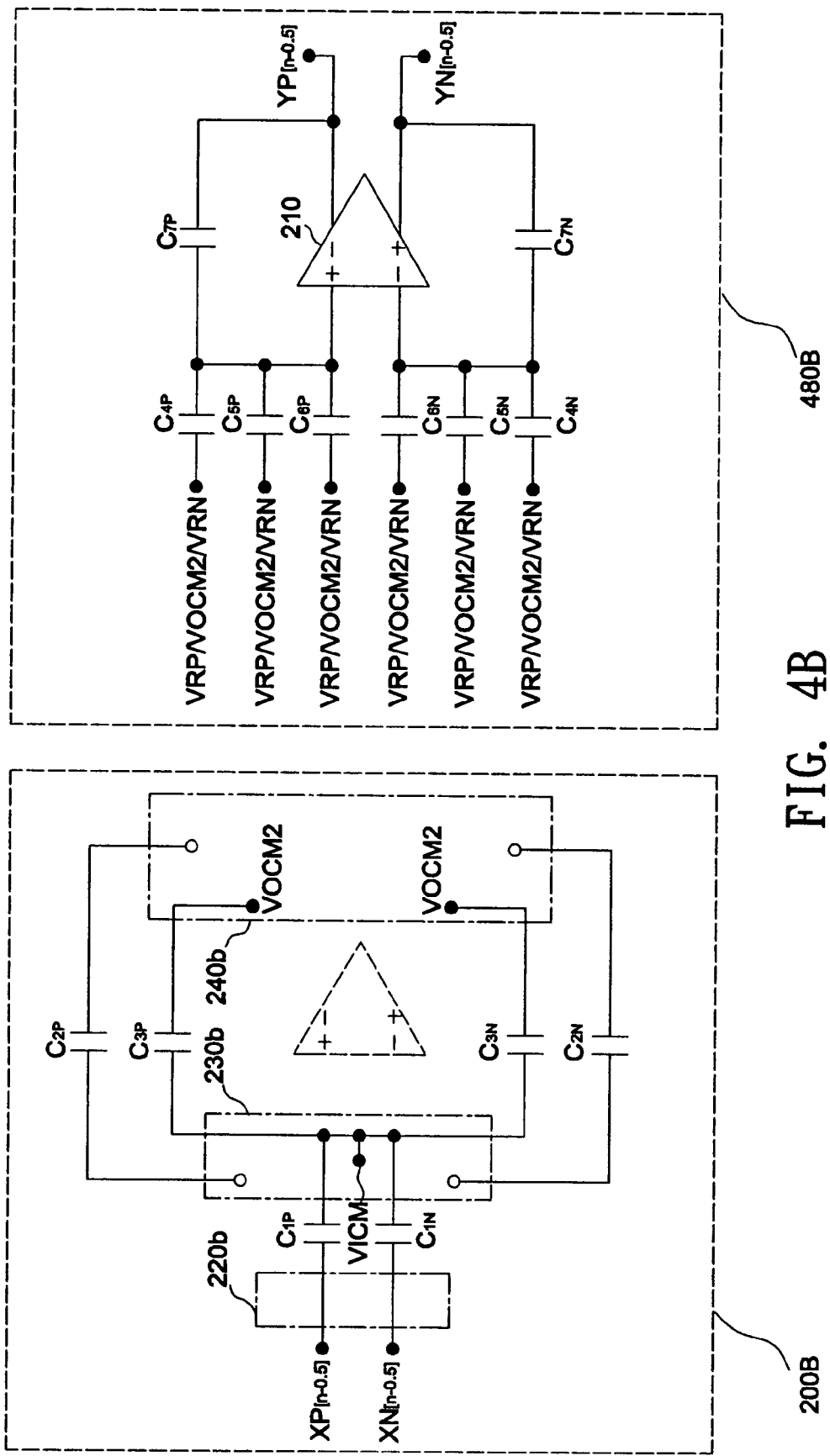
FIG. 4B is a circuit diagram of the IPR filter in state two according to the embodiment of the invention.

State Two: referring to FIGS. 3 and 4B, state two begins with a first rising edge B and is hereinafter called the sample mode. Suppose that the current time is Time=t[n−0.5]. The IPR filter 200A samples the input signals XP[n−0.5], XN[n−0.5] without the fully-differential amplifier 210, which is therefore represented in dotted lines. In the meantime, the MDAC1 circuit 480B uses the fully-differential amplifier 210 for operations, which is therefore represented in solid lines. During the period of state two, the output signals YP[n−0.5], YN[n−0.5] of the fully-differential amplifier 210 are the output signals of the IPR filter 200B. The input signals XP[n−0.5], XN[n−0.5] are fed respectively into the capacitors $C_{1P}$, $C_{1N}$, and the capacitors $C_{2P}$, $C_{2N}$ are floating. One terminal of each of the four capacitors $C_{1P}$, $C_{1N}$, $C_{3P}$, $C_{3N}$ are shorted together in the switch module 230b and is provided with a common-mode input voltage VICM. A common-mode output voltage VOCM2 is provided for the other terminal of the capacitors $C_{3P}$, $C_{3N}$ in the switch module 240b.

Since the capacitors $C_{2P}$, $C_{2N}$ are floating, the charge stored in the capacitors $C_{2P}$, $C_{2N}$ during the period of state two are respectively equal to those during the period of state one according to the charge conservation law. That is, the amount of charge in the capacitor $C_{2P}$ is $Q_{2P}$[n−0.5]=$Q_{2P}$[n−1]=C×YP[n−1] and the amount of charge in the capacitor $C_{2N}$ is $Q_{2N}$[n−0.5]=$Q_{2N}$[n−1]=C×YN[n−1]. Based on the small-signal model analysis, the voltages VICM, VOCM2 can be regarded as being grounded; therefore, $Q_{3P}$[n−0.5]=0 and $Q_{3N}$[n−0.5]=0. Apparently, the amount of charge in the capacitor $C_{1P}$ is $Q_{1P}$[n−0.5]=3C×XP[n−0.5] and the amount of charge in the capacitor $C_{1N}$ is $Q_{1N}$[n−0.5]=3C×XN[n−0.5]. Each of the six input terminals of the MDAC1 circuit 480B selects one of the three voltages VRP, VOCM2, VRN as their input according to a decision strategy mechanism and the output signals YP[n−0.5], YN[n−0.5] are thus generated.

Figure 4C:
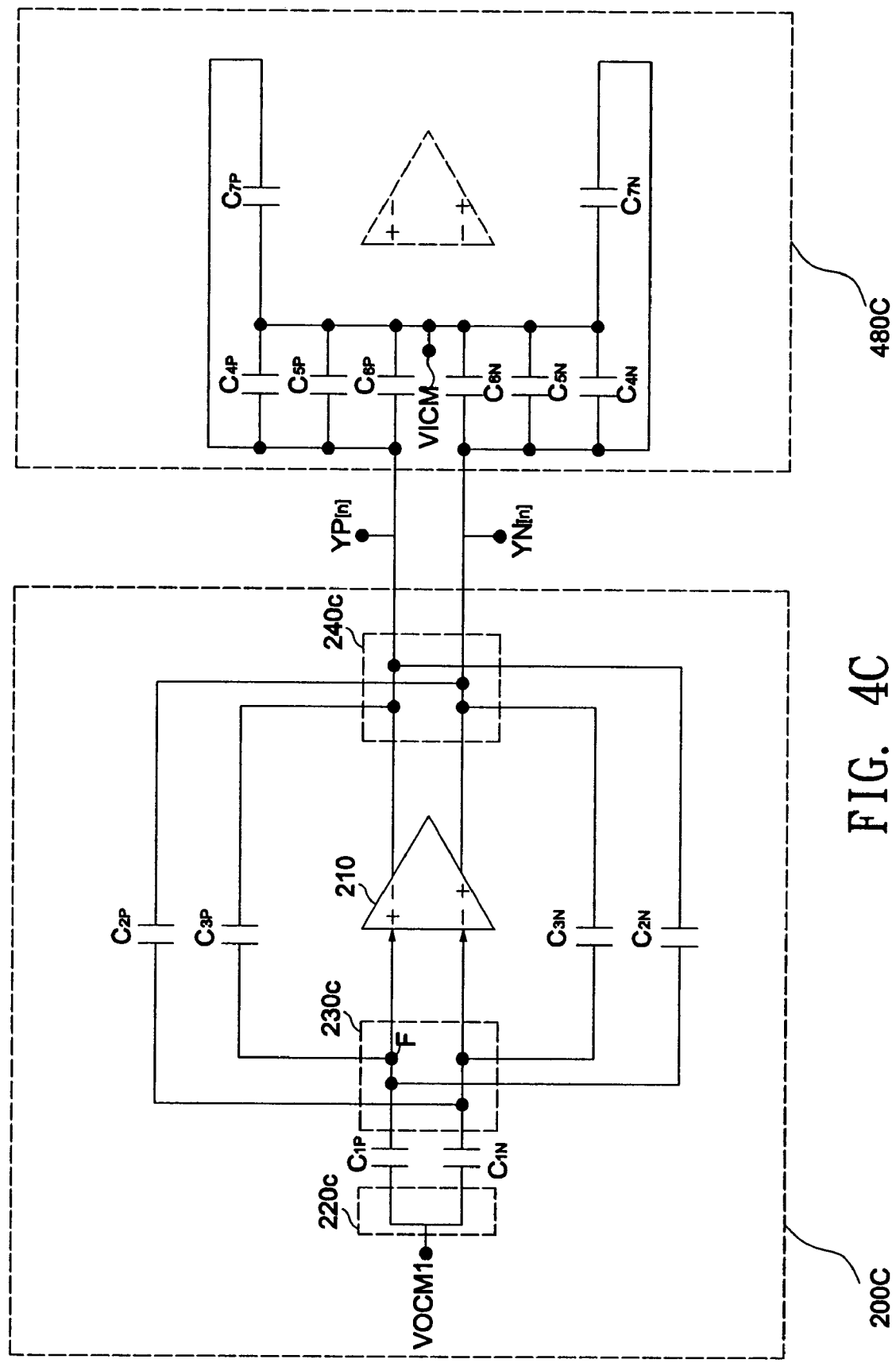
FIG. 4C is a circuit diagram of the IPR filter in state three according to the embodiment of the invention.

State Three: referring now to FIGS. 3 and 4C, state three begins with a second falling edge A and is hereinafter called the hold mode three. Suppose that the current time is Time=t[n]. The IPR filter 200A uses the fully-differential amplifier 210 for operations, which is therefore represented in solid lines. In the meantime, the MDAC1 circuit 480C operates without the fully-differential amplifier 210 that is represented in dotted lines. During the period of state three, the output signals YP[n], YN[n] of the fully-differential amplifier 210 are the output signals of the IPR filter 200C. The switch module 220c simultaneously feeds the front-end common-mode output voltage VOCM1 into the capacitors $C_{1P}$, $C_{1N}$. The positive (negative) input terminal of the fully-differential amplifier 210 and one terminal of each of the three capacitors $C_{1P}$, $C_{2N}$, $C_{3P}$ ($C_{1N}$, $C_{2N}$, $C_{3N}$) are shorted together in the switch module 230c. The negative (positive) output terminal of the fully-differential amplifier 210 and two capacitors $C_{2N}$, $C_{3P}$ ($C_{2N}$, $C_{3N}$) are shorted together in the switch module 240c. Please note that while operating in a differential mode, two halves of the fully-differential amplifier 210 are symmetrical, which allows us to use either of the two halves as the half-circuit. According to the charge conservation law, while Time=t[n−0.5] or Time=t[n], the amount of charge in a node F of the IPR filter 200c remains constant. Then, $Q_{1P}$[n−0.5]+$Q_{3P}$[n−0.5]+$Q_{2N}$[n−0.5]=$Q_{1P}$[n]+$Q_{3P}$[n]+$Q_{2N}$[n] ⇨ 3C×XP[n−0.5]+0+C×YN[n−1]=0+2C×YP[n]+C×YP[n] ⇨ 3C×XP[n−0.5]+0−C×YP[n−1]=0+2C×YP[n]+C×YP[n] ⇨ YP[n]=XP[n−0.5]−(⅓) YP[n−1].

Thus, the derived transfer function is $$H(z) = \frac{Y(Z)}{X(Z)} = 1 \bigg/ \left(1 + \frac{1}{3}z^{-1}\right)$$

Figure 4D:
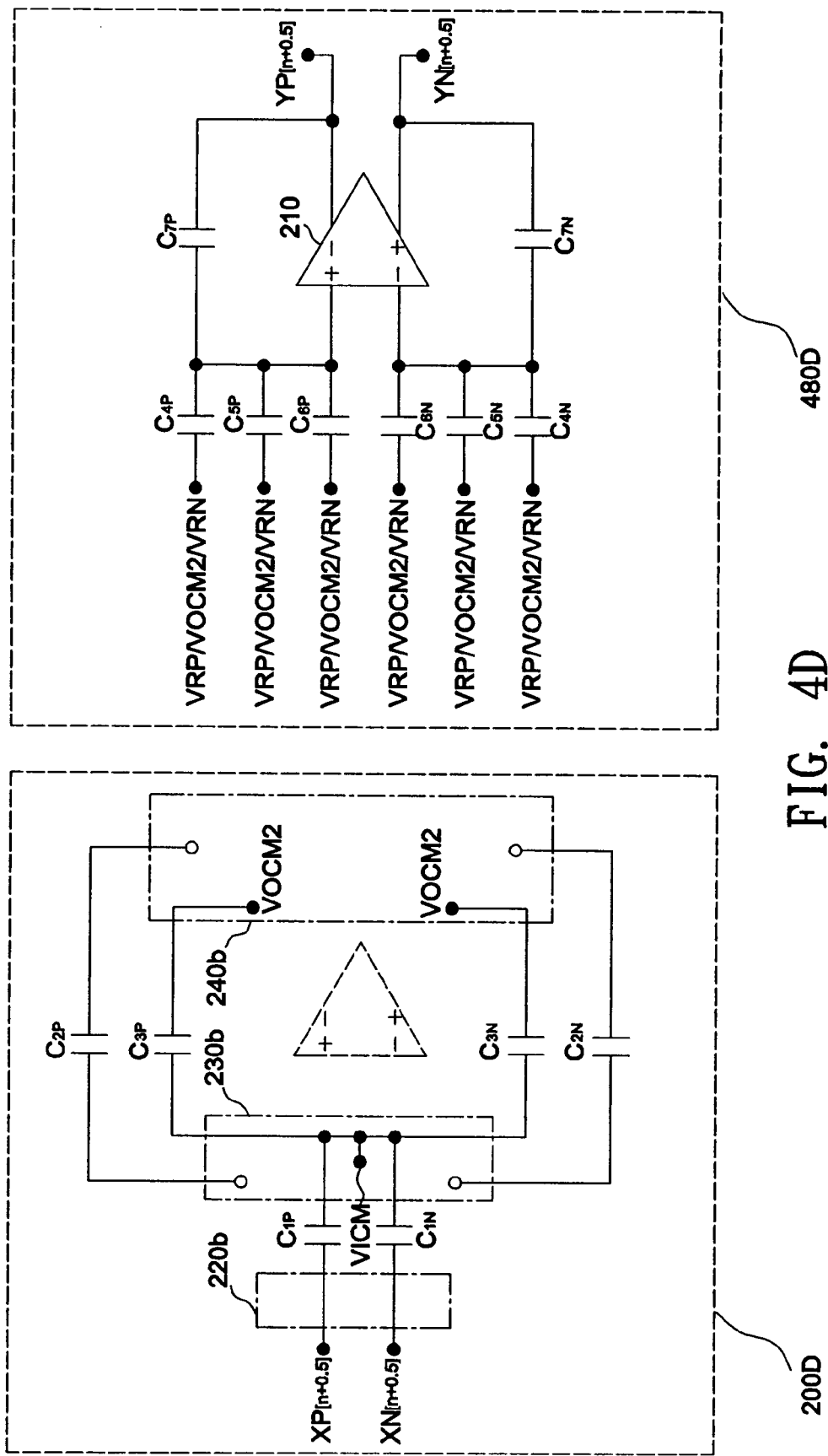
FIG. 4D is a circuit diagram of the IPR filter in state four according to the embodiment of the invention.

State Four: referring to FIGS. 3 and 4D, state four begins with a second rising edge B and is hereinafter called the sample mode. Suppose that the current time is Time=t[n+0.5]. The operations of the IPR filter 200D and the MDAC1 circuit 480D are the same as those of the IPR filter 200B and the MDAC1 circuit 480B during the period of state two, such that further description is therefore omitted herein. Since the capacitors $C_{2P}$, $C_{2N}$ are floating for the time being, the capacitors $C_{2P}$, $C_{2N}$ should have the same amount of charge as those during the period of state three. Therefore, the amount of charge in the capacitor $C_{2P}$ is $Q_{2P}$[n+0.5]=$Q_{2P}$[n]=C×YN[n] and the amount of charge in the capacitor $C_{2N}$ is $Q_{2N}$[n+0.5]=$Q_{2N}$[n]=C×YP[n]. Furthermore, based on the small-signal model analysis, the voltages VICM, VOCM2 can be regarded as being grounded. Therefore, $Q_{3P}$[n+0.5]=0 and $Q_{3N}$[n+0.5]=0, $Q_{1P}$[n−0.5]=3C×XP[n+0.5] and $Q_{1N}$[n−0.5]=3C×XN[n+0.5].

Figure 4E:
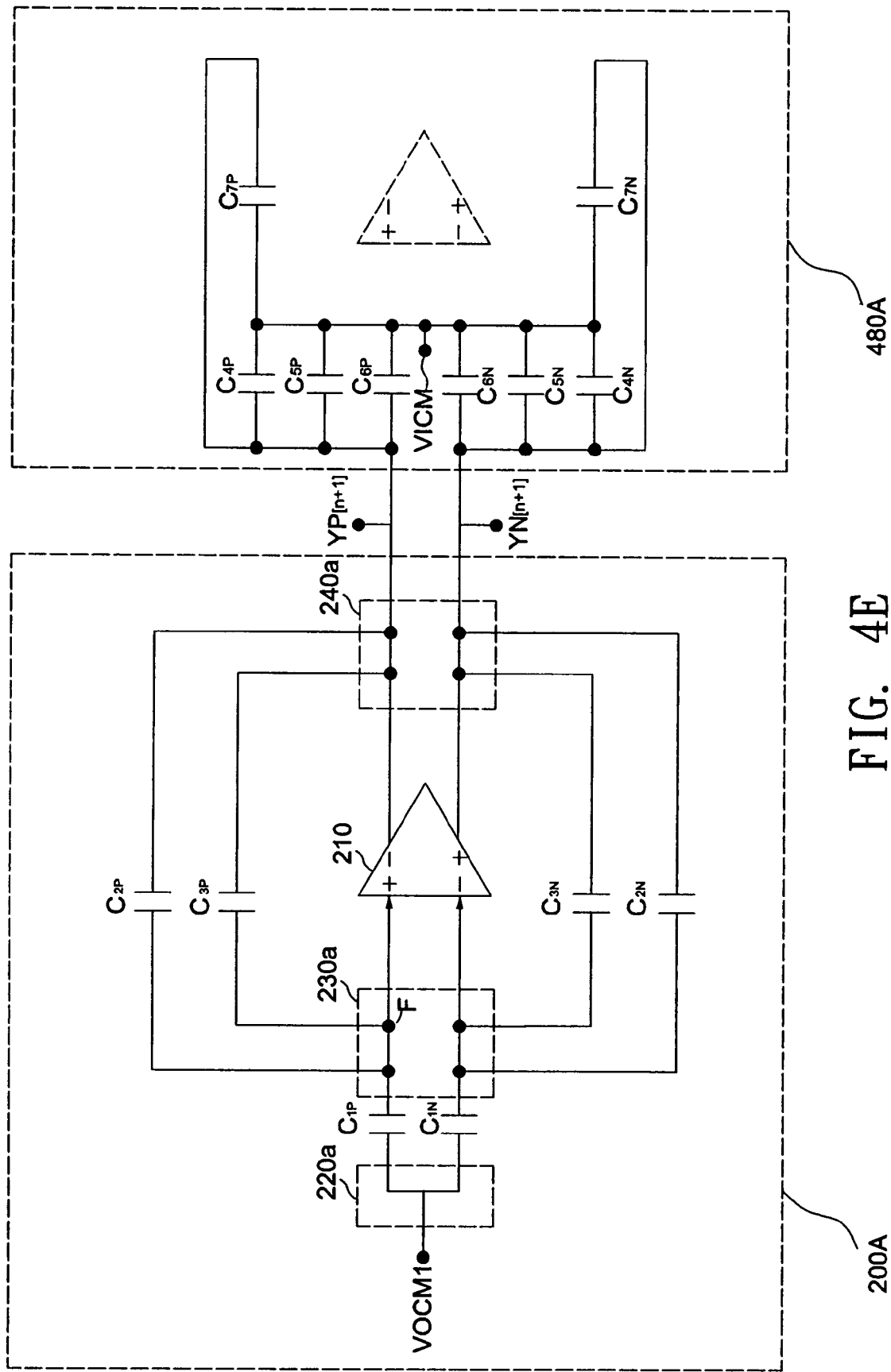
FIG. 4E is a circuit diagram of the IPR filter that returns to state one according to the embodiment of the invention.

The circuit then returns to state one. Referring to FIG. 4E, suppose that the current time is Time=t[n−1]. The output signals YP[n+1], YN[n+1] of the fully-differential amplifier 210 are the output signals of the IPR filter 200A. According to the charge conservation law, while Time=t[n+0.5] or Time=t [n+1], the amount of charge in a node F of the IPR filter 200c remains constant. Then, $Q_{1P}[n+0.5]+Q_{3P}[n+0.5]+Q_{2P}[n+0.5]=Q_{1P}[n+1]+Q_{3P}[n+1]+Q_{2P}[n+1]$ ⇨3C×XP[n+0.5]+0+C×YN[n]=0+2C×YP[n+1]+C×YP[n+1]⇨3C×XP[n+0.5]+0−C×YP[n]=0+2C×YP[n+1]+C×YP[n+1]⇨YP[n+1]= XP[n+0.5]−(⅓) YP[n]

Thus, the derived transfer function is $$H(z) = \frac{Y(Z)}{X(Z)} = 1 \bigg/ \left(1 + \frac{1}{3}z^{-1}\right)$$

To summarize, under the proposed condition that the IPR filter 200 shares a common fully-differential amplifier with the MDAC1 circuit of the ADC 115, the same transfer function $H(z) (=1/(1+Kz^{-1})$, where K<1) is still obtained. In comparison with a conventional IPR 114 having its own fully-differential amplifier, peak-to-average ratio and the magnitude of quantized noise is equally reduced and the same signal-to-noise ratio is attained. Therefore, the IPR filter 200 not only achieves the same function as that achieved conventionally, but also saves the cost of one fully-differential amplifier, and reducing the power consumption of the circuit as well. Nevertheless, it should be noted that the structures and the numbers of the switch modules and capacitors contained in the switch-capacitor circuit are not limited to these particular embodiments described above, as the switch-capacitor circuit may be modified and practiced in different but equivalent manners by referencing the teachings herein.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A filter circuit that shares a differential amplifier, comprising:
    a differential amplifier for receiving an input signal and generating an output signal; and
    a switch-capacitor circuit for storing charges generated by the input signal and the output signal and coupling with the differential amplifier during at least one of a plurality of state periods and decoupling with the differential amplifier during at least another one of the plurality of state periods;
    wherein the switch-capacitor circuit is coupled and decoupled from the differential amplifier during alternating state periods and wherein the input signal and the output signal generate the same transfer function during each of the plurality of state periods.

2. The filter circuit as claimed in claim 1 is an inverse partial response filter.

3. The filter circuit as claimed in claim 1, wherein the differential amplifier is a fully-differential amplifier.

4. The filter circuit as claimed in claim 1, wherein the switch-capacitor circuit comprises a plurality of switches and a plurality of capacitors for initiating the plurality of state periods.

5. The filter circuit as claimed in claim 4, wherein during a first state period of the plurality of state periods, a first capacitor of the plurality of capacitors is configured to receive the input signal and a second capacitor of the plurality of capacitors is configured to receive a first common-mode voltage, whereas during a second state period of the plurality of state periods, the first capacitor is configured to receive a second common-mode voltage and the second capacitor is configured to receive the output signal, and during a third state period of the plurality of state periods, the first capacitor of the plurality of capacitors is configured to receive the second common-mode voltage and a third capacitor is configured to receive the output signal, wherein capacitance of the second capacitor and the third capacitor is substantially equivalent.

6. The filter circuit as claimed in claim 5, wherein the second state period and the third state period occurs alternately in time whereas the first state period occurs in between occurrences of the second state period and the third state period.

7. The filter circuit as claimed in claim 5, wherein the switch-capacitor circuit is isolated from the differential amplifier during the first state period.

8. The filter circuit as claimed in claim 5, wherein the switch-capacitor circuit is coupled with the differential amplifier during the second state period and the third state period.

9. A method of filtering, applied to a circuit that shares a differential amplifier, comprising:
    receiving an input signal and generating an output signal by using a differential amplifier;
    storing charges generated by the input signal and the output signal by using a switch-capacitor circuit; and
    coupling the switch-capacitor circuit with the differential amplifier during at least one of a plurality of state periods;
    decoupling the switch-capacitor circuit from the differential amplifier during at least another one of a plurality of state periods such that coupling and decoupling occur in alternating state periods;
    wherein the input signal and the output signal generate the same transfer function during each of the plurality of state periods, and wherein the switch-capacitor circuit is isolated from the differential amplifier during a first state period.

10. The method as claimed in claim 9, wherein during the first state period of the plurality of state periods a first capacitor of the switch-capacitor circuit is configured to receive the input signal and a second capacitor of the switch-capacitor circuit is configured to receive a first common-mode voltage, whereas during a second state period of the plurality of state periods, the first capacitor is configured to receive a second common-mode voltage and the second capacitor is configured to receive the output signal, and during a third state period of the plurality of state periods, the first capacitor of the plurality of capacitors is configured to receive the second common-mode voltage and a third capacitor is configured to receive the output signal, wherein capacitance of the second capacitor and the third capacitor is substantially equivalent.

11. The method as claimed in claim 9, wherein a second state period and a third state period occurs alternately in time whereas the first state period occurs in between occurrences of the second state period and the third state period.

12. The method as claimed in claim 9, wherein the switch-capacitor circuit is coupled with the differential amplifier during a second state period and a third state period.

13. An inverse partial response filter for receiving a first input signal and second input signal and generating a first output signal and a second output signal, comprising:

six capacitors comprising a first capacitor, a second capacitor, a third capacitor, a fourth capacitor, a fifth capacitor and a sixth capacitor, each of which has a first terminal and a second terminal;

a fully-differential amplifier having a positive input terminal, a negative input terminal, a positive output terminal and a negative output terminal;

a first switch module coupled between a first terminal of the first capacitor and a first terminal of the second capacitor for receiving the first input signal, the second input signal and a front-end common-mode output voltage, and determining whether to transmit the first input signal, the second input signal and the front-end common-mode output voltage to the first capacitor and the second capacitor;

a second switch module coupled to a second terminal of the first capacitor, a second terminal of the second capacitor, a first terminal of the third capacitor, a first terminal of the fourth capacitor, a first terminal of the fifth capacitor, a first terminal of the sixth capacitor, and the positive and negative input terminals of the fully-differential amplifier for determining a coupling relationship of the second terminal of the first capacitor, the second terminal of the second capacitor, the first terminal of the third capacitor, the first terminal of the fourth capacitor, the first terminal of the fifth capacitor, the first terminal of the sixth capacitor, the positive and negative input terminals of the fully-differential amplifier; and a third switch module coupled to a second terminal of the third capacitor, a second terminal of the fourth capacitor, a second terminal of the fifth capacitor, a second terminal of the sixth capacitor, and the positive and negative output terminals of the fully-differential amplifier for determining a coupling relationship of the second terminal of the third capacitor, the second terminal of the fourth capacitor, the second terminal of the fifth capacitor, the second terminal of the sixth capacitor, the positive and negative output terminals of the fully-differential amplifier; wherein the fully-differential amplifier is shared between the inverse partial response filter and other circuits and the inverse partial response filter operates repeatedly according to a plurality of state periods.

14. The inverse partial response filter as claimed in claim 13, wherein capacitance of the first capacitor and the second capacitor is three times that of the third capacitor and capacitance of the fourth capacitor and the fifth capacitor is two times that of the third capacitor, and capacitance of the third capacitor and the sixth capacitor is substantially equivalent.

15. The inverse partial response filter as claimed in claim 13, wherein the number of the plurality of state periods is equal to four and the plurality of state periods comprise a first state period, a second state period, a third state period and a fourth state period.

16. The inverse partial response filter as claimed in claim 15, wherein during the first state period, the first terminal of the first capacitor and the first terminal of the second capacitor are arranged to simultaneously receive the front-end common-mode output voltage in the first switch module, the second terminal of the first capacitor, the first terminal of the third capacitor, the first terminal of the fourth capacitor and the positive input terminal of the fully-differential amplifier are shorted together and the second terminal of the second capacitor, the first terminal of the fifth capacitor, the first terminal of the sixth capacitor and the negative input terminal of the fully-differential amplifier are shorted together in the second switch module, and the second terminal of the third capacitor, the second terminal of the fourth capacitor and the negative output terminal of the fully-differential amplifier are shorted together to generate the first output signal, and the second terminal of the fifth capacitor, the second terminal of the sixth capacitor and the positive output terminal of the fully-differential amplifier are shorted together to generate the second output signal in the third switch module.

17. The inverse partial response filter as claimed in claim 16, wherein during the second state period, the first terminal of the first capacitor is arranged to receive the first input signal and the first terminal of the second capacitor is arranged to receive the second input signal in the first switch module, the first terminal of the third capacitor and the first terminal of the sixth capacitor are floating and the second terminal of the first capacitor, the first terminal of the fourth capacitor, the second terminal of the second capacitor and the first terminal of the fifth capacitor are shorted together and arranged to receive a common-mode input voltage in the second switch module, and the second terminal of the third capacitor and the second terminal of the sixth capacitor are floating and the second terminal of the fourth capacitor, the second terminal of the fifth capacitor are arranged to receive a common-mode output voltage in the third switch module.

18. The inverse partial response filter as claimed in claim 17, wherein during the third state period, the first terminal of the first capacitor and the first terminal of the second capacitor are arranged to simultaneously receive the front-end common-mode output voltage in the first switch module, the second terminal of the first capacitor, the first terminal of the fourth capacitor, the first terminal of the sixth capacitor and the positive input terminal of the fully-differential amplifier are shorted together and the second terminal of the second capacitor, the first terminal of the third capacitor, the first terminal of the fifth capacitor and the negative input terminal of the fully-differential amplifier are shorted together in the second switch module, and the second terminal of the fourth capacitor, the second terminal of the sixth capacitor and the negative output terminal of the fully-differential amplifier are shorted together to generate the first output signal, and the second terminal of the third capacitor, the second terminal of the fifth capacitor and the positive output terminal of the fully-differential amplifier are shorted together to generate the second output signal in the third switch module.

19. The inverse partial response filter as claimed in claim 18, wherein during the fourth state period, the first terminal of the first capacitor is arranged to receive the first input signal and the first terminal of the second capacitor is arranged to receive the second input signal in the first switch module, the first terminal of the third capacitor and the first terminal of the sixth capacitor are floating and the second terminal of the first capacitor, the first terminal of the fourth capacitor, the second terminal of the second capacitor and the first terminal of the fifth capacitor are shorted together and arranged to receive the common-mode input voltage in the second switch module, and the second terminal of the third capacitor and the second terminal of the sixth capacitor are floating and the second terminal of the fourth capacitor, the second terminal of the fifth capacitor are arranged to receive the common-mode output voltage in the third switch module.

20. A filter circuit that shares a differential amplifier, comprising:

a differential amplifier for receiving an input signal and generating an output signal; and a switch-capacitor circuit for storing charges generated by the input signal and the output signal and coupling with the differential amplifier during at least one of a plurality of state periods, the switch-capacitor circuit comprising a plurality of switches and a plurality of capacitors for initiating the plurality of state periods;

wherein the input signal and the output signal generate the same transfer function during each of the plurality of state periods and during a first state period of the plurality of state periods, a first capacitor of the plurality of capacitors is configured to receive the input signal and a second capacitor of the plurality of capacitors is configured to receive a first common-mode voltage, whereas during a second state period of the plurality of state periods, the first capacitor is configured to receive a second common-mode voltage and the second capacitor is configured to receive the output signal, and during a third state period of the plurality of state periods, the first capacitor of the plurality of capacitors is configured to receive the second common-mode voltage and a third capacitor is configured to received the output signal, wherein capacitance of the second capacitor and the third capacitor is substantially equivalent.

21. The filter circuit as claimed in claim 20 is an inverse partial response filter and the differential amplifier is a fully-differential amplifier.

22. The filter circuit as claimed in claim 20, wherein the second state period and the third state period occurs alternately in time whereas the first state period occurs in between occurrences of the second state period and the third state period.

23. The filter circuit as claimed in claim 20, wherein the switch-capacitor circuit is isolated from the differential amplifier during the first state period.

24. A method of filtering, applied to a circuit that shares a differential amplifier, comprising:

receiving an input signal and generating an output signal by using a differential amplifier;

storing charges generated by the input signal and the output signal by using a switch-capacitor circuit; and coupling the switch-capacitor circuit with the differential amplifier during at least one of a plurality of state periods;

wherein the input signal and the output signal generate the same transfer function during each of the plurality of state periods and during a first state period of the plurality of state periods a first capacitor of the switch-capacitor circuit is configured to receive the input signal and a second capacitor of the switch-capacitor circuit is configured to receive a first common-mode voltage, whereas during a second state period of the plurality of state periods, the first capacitor is configured to receive a second common-mode voltage and the second capacitor is configured to receive the output signal, and during a third state period of the plurality of state periods, the first capacitor of the plurality of capacitors is configured to receive the second common-mode voltage and a third capacitor is configured to receive the output signal, wherein the capacitance of the second capacitor and the third capacitor is substantially equivalent.

25. The method as claimed in claim 24, wherein the second state period and the third state period occurs alternately in time whereas the first state period occurs in between occurrences of the second state period and the third state period.

26. The method as claimed in claim 24, wherein the switch-capacitor circuit is isolated from the differential amplifier during a first state period.

27. The method as claimed in claim 24, wherein the switch-capacitor circuit is coupled with the differential amplifier during the second state period and the third state period.

28. A filter circuit configured to share a differential amplifier with a second circuit, comprising:

a differential amplifier for receiving an input signal and generating an output signal, wherein the differential amplifier is shared by the filter circuit and the second circuit; and a switch-capacitor circuit for coupling with the differential amplifier during at least one of a plurality of state periods, the switch-capacitor circuit comprising a plurality of switches and a plurality of capacitors for transitioning between the plurality of state periods;

wherein during one or more state periods, the switches in the switch-capacitor circuit isolate the differential amplifier from the filter circuit and couple the differential amplifier with the second circuit, and wherein during periods alternating with the one or more state periods, the switches in the switch-capacitor circuit couple the differential amplifier with the filter circuit and isolate the differential amplifier from the second circuit.

29. A method of filtering, applied to a circuit that shares a differential amplifier, comprising:

receiving an input signal and generating an output signal with a differential amplifier;

storing charges generated by the input signal and the output signal with a switch-capacitor circuit; and coupling the switch-capacitor circuit with the differential amplifier during at least one of a plurality of state periods, wherein the switch-capacitor circuit is isolated from the differential amplifier during alternating state periods, and wherein the input signal and the output signal generate the same transfer function during each of the plurality of state periods.

30. A filter circuit configured to share a differential amplifier with a second circuit, comprising:

a differential amplifier shared by the filter circuit and the second circuit for receiving an input signal and generating an output signal; and a switch-capacitor circuit for coupling with the differential amplifier during alternating sample-hold periods, the switch-capacitor circuit comprising a plurality of switches and a plurality of capacitors for transitioning between the plurality of sample-hold periods;

wherein during hold periods, the filter circuit operates with the differential amplifier and the second circuit operates without the differential amplifier, and wherein during sample periods, the filter circuit operates without the differential amplifier and the second circuit operates with the differential amplifier.

* * * * *